(12) United States Patent
Fagg et al.

(10) Patent No.: US 7,902,936 B2
(45) Date of Patent: *Mar. 8, 2011

(54) METHOD AND APPARATUS FOR GENERATING OSCILLATING SIGNALS

(75) Inventors: Russell John Fagg, San Diego, CA (US); Charles E. Wheatley, III, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 12/411,278

(22) Filed: Mar. 25, 2009

(65) Prior Publication Data

US 2009/0184777 A1 Jul. 23, 2009

Related U.S. Application Data

(63) Continuation of application No. 11/696,875, filed on Apr. 5, 2007, now Pat. No. 7,592,878.

(51) Int. Cl.
 *H03L 1/00* (2006.01)
(52) U.S. Cl. .................. 331/186; 331/16; 327/337
(58) Field of Classification Search .............. 331/186, 331/16; 327/337
 See application file for complete search history.

(56) References Cited

U.S. PATENT DOCUMENTS

| | | | |
|---|---|---|---|
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,834,982 A | 11/1998 | Watanabe et al. | |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,084,483 A * | 7/2000 | Keshtbod | 331/57 |

(Continued)

FOREIGN PATENT DOCUMENTS

EP 0709965 5/1996

OTHER PUBLICATIONS

International Search Report—PCT/US07/068997, International Search Authority—European Patent Office, Feb. 13, 2008.

(Continued)

*Primary Examiner* — Vibol Tan
(74) *Attorney, Agent, or Firm* — Dang M. Vo (57) ABSTRACT

An apparatus for generating an oscillating signal that includes a circuit to accelerate the time in which an oscillating signal reaches a defined steady-state condition from a cold start. The apparatus includes an oscillating circuit to generate an oscillating signal; a first circuit to supply a first current to the oscillating circuit; and a second circuit to supply a second current to the oscillating circuit, wherein the first and second currents are adapted to reduce the time duration for the oscillating signal to reach a defined steady-state condition. The apparatus may be useful in communication systems that use low duty cycle pulse modulation to establish one or more communications channels, whereby the apparatus begins generating an oscillating signal at approximately the beginning of the pulse and terminates the oscillating signal at approximately the end of the pulse.

40 Claims, 8 Drawing Sheets

U.S. PATENT DOCUMENTS

| | | | |
|---|---|---|---|
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,526,111 B1 * | 2/2003 | Prasad | 375/376 |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Fullerton et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,900,732 B2 | 5/2005 | Richards | |
| 6,906,596 B2 | 6/2005 | Kitamura et al. | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,980,613 B2 | 12/2005 | Krivokapic | |
| 6,989,718 B2 | 1/2006 | Pretl et al. | |
| 6,989,751 B2 | 1/2006 | Richards | |
| 7,015,742 B2 * | 3/2006 | Ke | 327/337 |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,806 B2 | 4/2006 | Fullerton | |
| 7,038,552 B2 | 5/2006 | Brett et al. | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,079,827 B2 | 7/2006 | Richards et al. | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,259,638 B2 | 8/2007 | Takahashi | |
| 7,271,779 B2 | 9/2007 | Hertel | |
| 7,285,995 B2 * | 10/2007 | Kaizuka | 327/157 |
| 2004/0257143 A1 * | 12/2004 | Ke | 327/337 |
| 2005/0156673 A1 * | 7/2005 | Pretl et al. | 331/16 |
| 2005/0184774 A1 * | 8/2005 | Kaizuka | 327/157 |
| 2005/0285686 A1 * | 12/2005 | Pettersen et al. | 331/16 |

OTHER PUBLICATIONS

Written Opinion—PCT/US07/068997, International Search Authority—European Patent Office, Feb. 13, 2008.
Partial European Search Report—EP08006311, Search Authority—Munich Patent Office, Sep. 17, 2008.
European Search Opinion—EP08006311, Search Authority—Munich Patent Office, Sep. 17, 2008.

* cited by examiner

METHOD AND APPARATUS FOR GENERATING OSCILLATING SIGNALS

CLAIM OF PRIORITY UNDER 35 U.S.C. §120

The present Application for patent is a continuation of patent application Ser. No. 11/696,875 entitled "METHOD AND APPARATUS FOR GENERATING OSCILLATING SIGNALS", filed Apr. 5, 2007, pending, and assigned to the assignee hereof and hereby expressly incorporated by reference herein.

FIELD

This disclosure relates generally to generating oscillating signals, and in particular, to reducing time for an oscillating signal to reach a defined steady-state condition.

BACKGROUND

Previous communication systems use techniques that are generally power inefficient. These systems typically employ transmitters and receivers that may require continuous power even during times when they are not transmitting or receiving communications. Such systems that remain idle while still consuming power are typically inefficient from a power perspective.

In some applications, power inefficient communication devices may present limitations as to their continuous use. For example, portable communication devices that rely on battery power generally provide relatively short continuous operation before the battery needs to be replaced or recharged. In some situations, this may result in adverse consequences, such as data loss, communication delays, dropped sessions, and down time.

On the other hand, communication systems that consume substantially lower power during idle times are able to operate for longer periods with a limited power source. Thus, communication systems that power on a transmitter only when the signal is to be transmitted will generally consume less power than a transmitter that is continuously powered. Similarly, communication systems that power on a receiver only when the signal is to be received will generally consume less power than a receiver that is continuously powered.

A pulse modulator may be used to control the times for transmitting and receiving signals. In this regard, a pulse modulator may power on a transmitter local oscillator (LO) for transmitting a signal only for the duration of a pulse. Similarly, a pulse modulator may power on a receiver LO for receiving a signal only for the duration of a pulse. In this capacity, the LO generates and sustains an oscillating signal within the duration of each pulse. If the pulse width is relatively short, such as in a low duty cycle application, the LO should respond quickly to generate a sufficiently stable oscillating signal.

SUMMARY

A summary of sample aspects of the disclosure follows. For convenience, one or more aspects of the disclosure may be referred to herein simply as "some aspects."

Some aspects of the disclosure relate to an apparatus for generating an oscillating signal. The apparatus comprises a first circuit to generate an oscillating signal, a second circuit too supply a first current to the first circuit; and a third circuit to supply a second current to the first circuit, wherein the first and second currents are adapted to reduce the time duration for the oscillating signal to reach a defined steady-state condition.

In some aspects, the apparatus may be configured as a voltage controlled oscillator (VCO). In this regard, the second circuit may be configured as a boost bias circuit to accelerate the time in which an oscillating signal reaches a defined steady-state condition from a cold start. This is particularly useful in communication systems and devices that use low duty cycle pulse modulation to establish one or more communications channels. In such applications, the VCO, serving as a local oscillator (LO), begins generating an oscillating signal at approximately the beginning of the pulse and terminates the oscillating signal at approximately the end of the pulse. For improved communication performance, the oscillating signal should reach a defined steady-state condition within a relatively short time period as compared to the width of the pulse.

In some aspects, the VCO comprises an oscillating circuit to generate an oscillating signal; a quiescent bias circuit to supply a quiescent current to the oscillating circuit; and a boost bias circuit to supply a boost current to the oscillating circuit, wherein the boost current and the quiescent current are adapted to reduce the time duration for the oscillating signal to reach a defined steady-state condition.

In some aspects, the first circuit of the apparatus may comprise a tank circuit coupled to a negative resistance generator. The tank circuit, in turn, may comprise an inductive element coupled to a capacitive element. The capacitive element may comprise a programmable switched capacitor bank for tuning the frequency of the oscillating signal.

In some aspects, the apparatus may further comprise a steady-state detector adapted to disable the third circuit from supplying the second current to the first circuit in response to detecting the defined steady-state condition of the oscillating signal. Thus, the third circuit may only be used upon start up to quickly achieve the defined steady-state condition of the oscillating signal. The defined steady-state condition of the oscillating signal may specify a stability requirement for the amplitude and/or frequency of the oscillating signal.

In some aspects, the apparatus may further comprise a frequency calibration unit adapted to tune the first circuit so that the oscillating signal cycles within a defined frequency range. In some communications systems, such as energy detection systems, the frequency of the LO need not be that precise. For example, the defined frequency range may be up to five (5) percent of a defined center frequency. The frequency calibration unit may be adapted to calibrate or tune the first circuit upon power up, upon detecting an ambient temperature change above a defined threshold, and/or upon receiving a new frequency specification for the oscillating signal.

In some aspects, one or more apparatuses may be used as local oscillators (LOs) in communication systems and devices to up convert and down convert signals. For example, the apparatus may be used to establish one or more ultra-wide band (UWB) channels for communicating with other devices using pulse division multiple access (PDMA), pulse division multiplexing (PDM), or other types of pulse modulation techniques. A UWB channel may be defined as having a fractional bandwidth on the order of 20% or more, a bandwidth on the order of 500 MHz or more, or both. The fractional bandwidth is a particular bandwidth associated with a device divided by its center frequency. For example, a device according to this disclosure may have a bandwidth of 1.75 GHz with center frequency 8.125 GHz and thus its fractional bandwidth is 1.75/8.125 or 21.5%.

In some aspects, the apparatus may be implemented in or comprise a headset, medical device, microphone, biometric sensor, heart rate monitor, pedometer, EKG device, user I/O device, watch, remote control, switch, tire pressure monitor, entertainment device, computer, point-of-sale device, hearing aid, set-top box, cell phone, or a device with some form of wireless signaling capability. In some aspects, the apparatus may be implemented in or comprise an access point such as a WiFi node. For example, the access point may provide connectivity to another network (e.g., a wide area network such as the Internet) via a wired or wireless communication link.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, the inventive device or apparatus according to this disclosure comprises a first circuit to generate an oscillating signal; a second circuit to supply a first current to the first circuit; and a third circuit to supply a second current to the first circuit, wherein the first and second currents are adapted to reduce a time duration for the oscillating signal to reach a defined steady-state condition. In other aspects, the inventive apparatus may comprise a VCO that in turn comprises a single circuit adapted to generate an initial higher current for the oscillating circuit to accelerate the generation of a defined steady-state oscillating signal, and a subsequent lower current for the oscillating circuit to sustain the generation of the defined steady-state oscillating signal. The term "defined" as used herein may be construed as "predetermined", "predefined", or "dynamically defined."

Figure 1A:
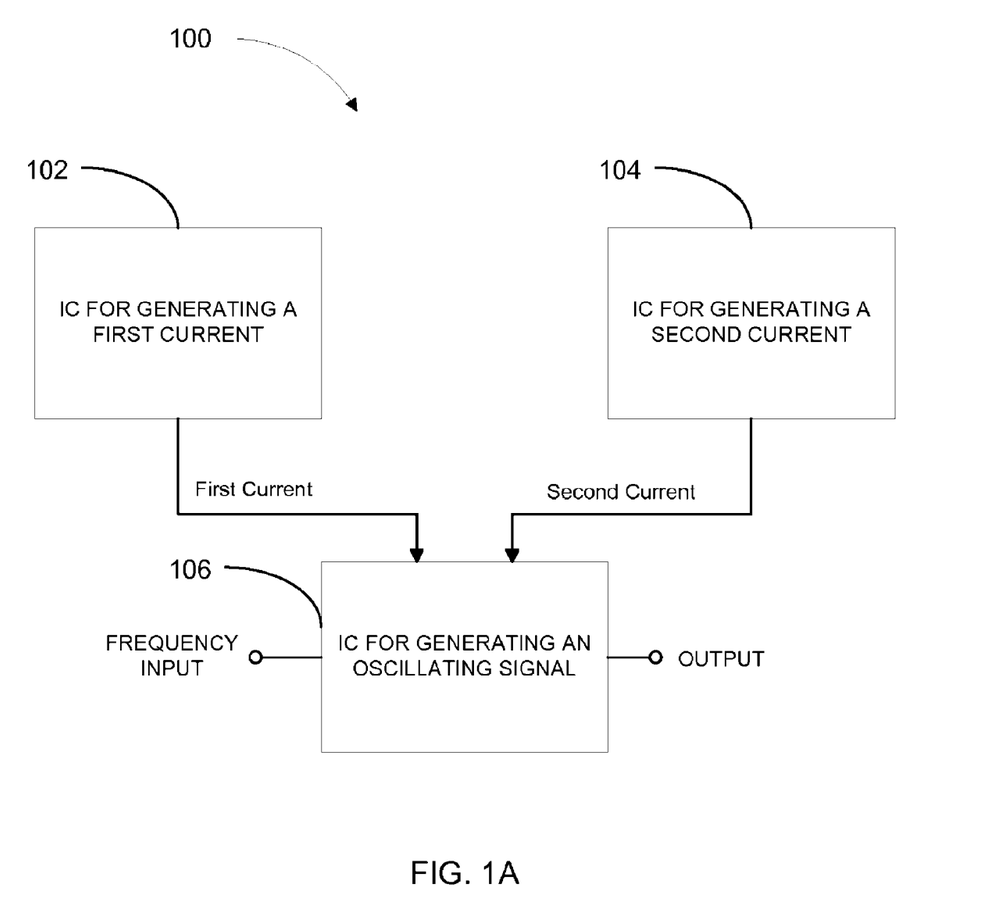
FIG. 1A illustrates a block diagram of an exemplary apparatus for generating an oscillating signal in accordance with some aspects of the disclosure.

FIG. 1A illustrates a block diagram of an exemplary apparatus 100 for generating an oscillating signal in accordance with some aspects of the disclosure. The apparatus 100 is capable of generating an oscillating signal having a frequency dictated by a frequency input. In some aspect, the apparatus 100 may be configured or comprise a voltage controlled oscillator (VCO). The apparatus 100 comprises an integrated circuit to generate first and second currents to accelerate the oscillating signal in reaching a defined steady-state condition from a start up condition. As discussed in more detail below, this is particularly useful for communication devices that use relatively low duty cycle pulse modulation to establish communication channels. In this regard, the apparatus 100 begins generating the oscillating signal at approximately the beginning of the pulse and stops generating the oscillating signal at approximately the end of the pulse.

More specifically, the apparatus 100 comprises an integrated circuit (IC) 102 for generating a first current (e.g., a quiescent bias current), an IC 104 for generating a second current (e.g., a boost bias current), and an IC 106 for generating an oscillating signal 106. Although in this example, the ICs 102, 104, and 106 are shown as separate ICs, it shall be understood that any of these may be configured into one or more ICs. The IC 106 generates an oscillating signal (e.g., a sinusoidal signal) cycling at a frequency dictated by a frequency input. The IC 102 provides a first current to the IC 106 during start-up and steady-state conditions. The IC 104 provides a second current to the IC 106 during start up to accelerate the oscillating signal in reaching a defined steady-state condition. The defined steady-state condition may specify a stability requirement for the frequency and/or the amplitude of the oscillating signal.

Figure 1B:
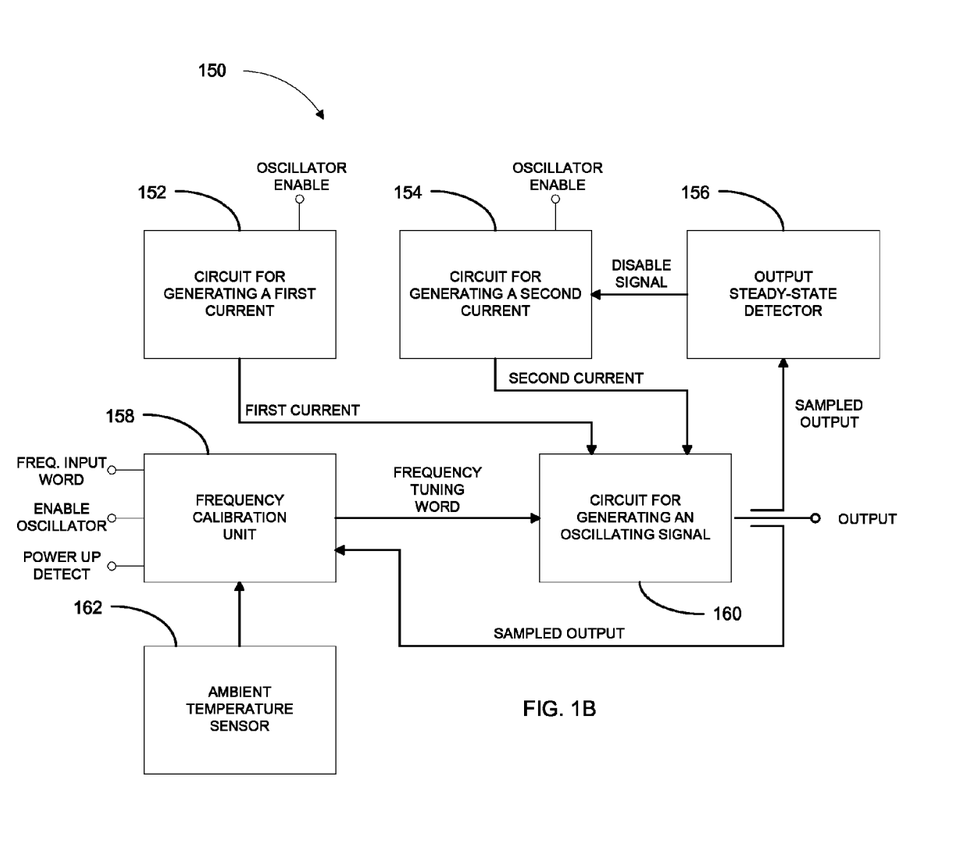
FIG. 1B illustrates a block diagram of an exemplary apparatus for generating an oscillating signal in accordance with some aspects of the disclosure.

FIG. 1B illustrates a block diagram of an exemplary apparatus 150 for generating an oscillating signal in accordance with some aspects of the disclosure. The apparatus 150 may be a more detailed implementation of the apparatus 100 previously discussed. In particular, the apparatus 150 comprises a circuit 152 for generating a first current (e.g., a quiescent bias current), a circuit 154 for generating a second current (e.g., a boost bias current), an output steady-state detector 156, a frequency calibration unit 158, a circuit 160 for generating an oscillating signal ("oscillating circuit"), and an ambient temperature sensor 162. The circuit 160 generates an oscillating signal cycling with a frequency that is tunable via a frequency tuning word received from the frequency calibration unit 158.

The frequency calibration unit 158 receives a frequency input word that specifies the frequency or frequency range of the oscillating signal, and measures the actual frequency of the oscillating signal from a sample received from the output of the oscillating circuit 160. Based on the frequency input word and the measured frequency, the frequency calibration unit 158 generates a frequency tuning word that tunes the oscillating circuit 160 so that the frequency of the oscillating signal is within the requirement specified by the frequency input word. The frequency calibration unit 158 may calibrate the frequency of the oscillating signal upon power up, upon receiving a new frequency input word, and/or upon detecting a change in ambient temperature that exceeds a defined threshold. The frequency calibration unit 158 receives temperature information from the ambient temperature sensor 162.

The circuit 152 provides a first current to the oscillating circuit 160 during start-up and steady-state conditions. The boost bias circuit 154 provides a second current to the oscillating circuit 160 during start up to accelerate the oscillating signal reaching a defined steady-state condition from a start up condition. The output steady-state detector 156 samples the output of the oscillating circuit 160 in order to disable the circuit 154 when the detector 156 detects the defined steady-state condition of the oscillating signal. Thus, the circuit 154 is used during start up of the oscillating circuit 160 in order to reduce the time for the oscillating signal to reach the defined steady-state. As previously discussed, the defined steady-state condition may specify a stability requirement for the frequency and/or the amplitude of the oscillating signal.

Figure 1C:
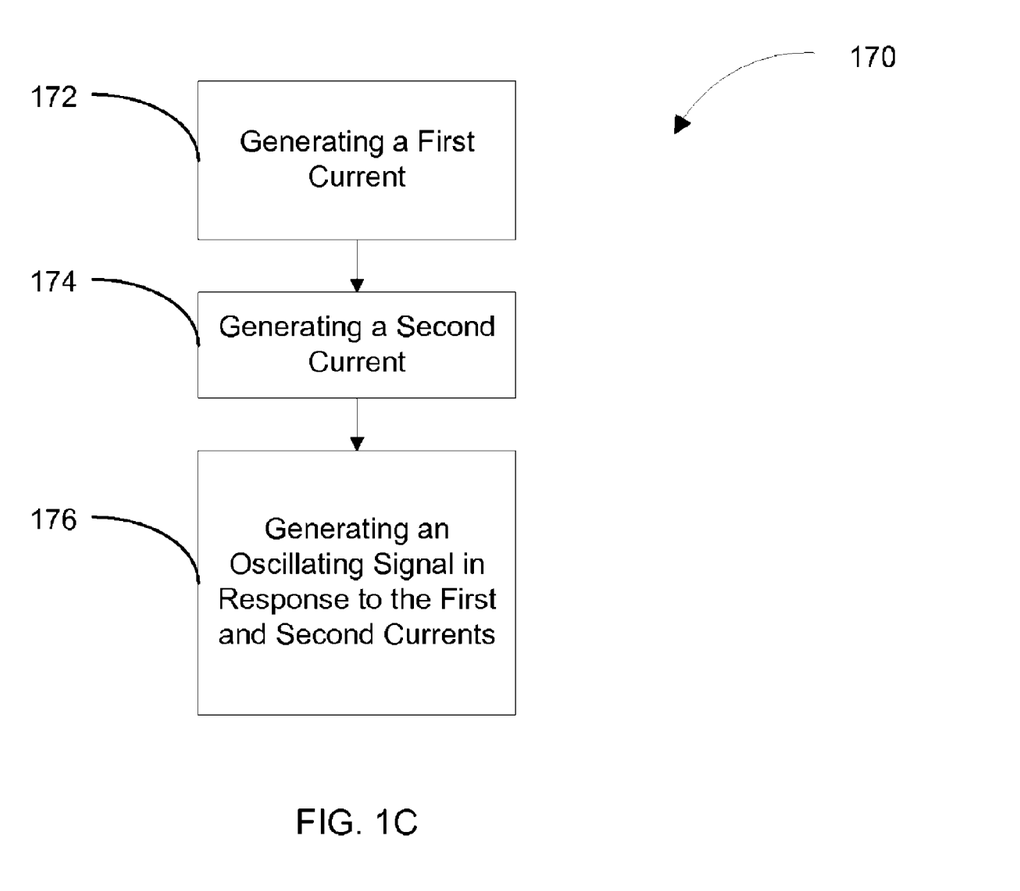
FIG. 1C illustrates a flow diagram of an exemplary method of generating an oscillating signal in accordance with some aspects of the disclosure.

FIG. 1C illustrates a flow diagram of an exemplary method 170 of generating an oscillating signal in accordance with some aspects of the disclosure. According to the method 170, a first current (e.g., a quiescent bias current) is generated (block 171). Additionally, a second current (e.g., a boost bias current) is generated (block 174). Then, an oscillating signal is generated in response to the first and second currents (block 176).

Figure 2:
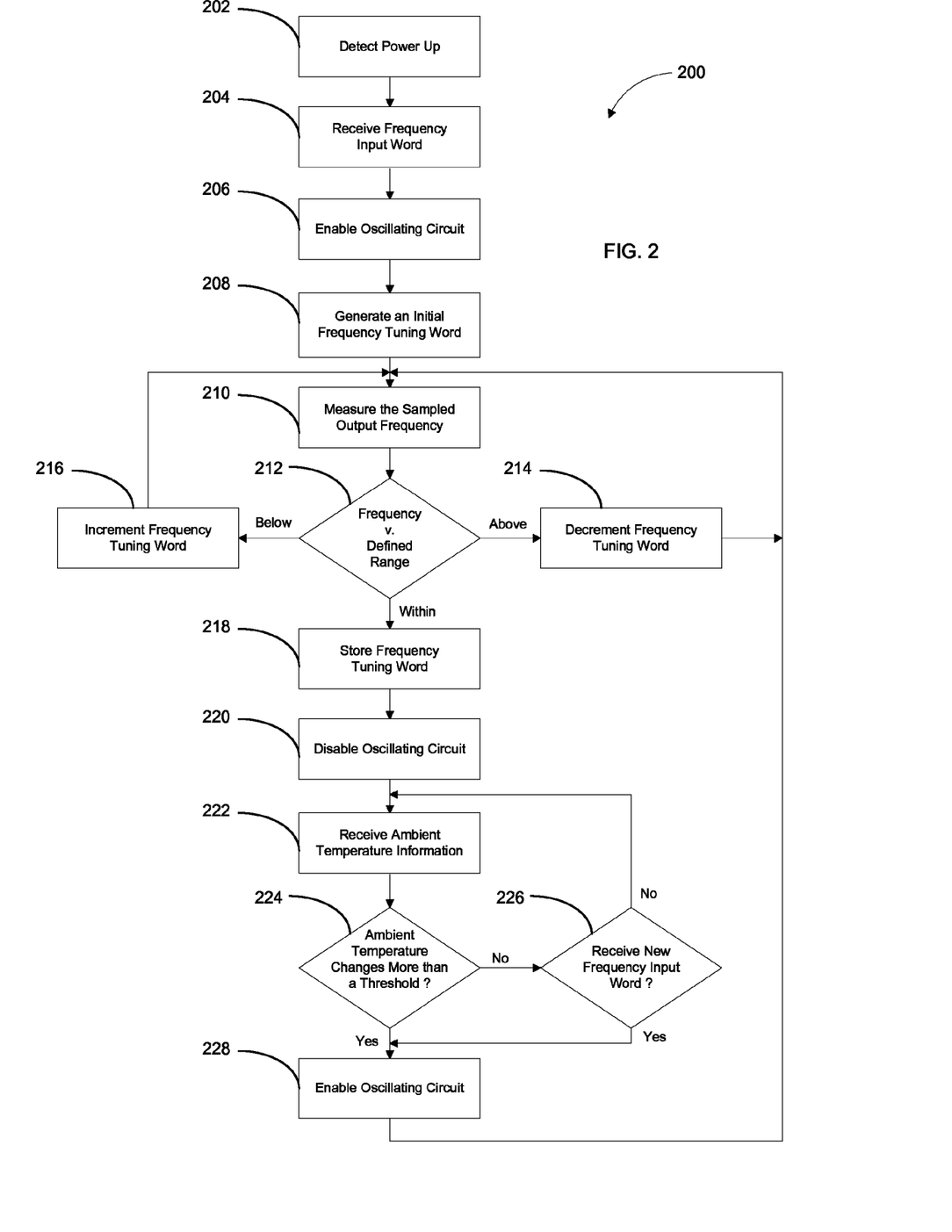
FIG. 2 illustrates a flow diagram of an exemplary method of calibrating an apparatus for generating an oscillating signal in accordance with some aspects of the disclosure.

FIG. 2 illustrates a flow diagram of an exemplary method 200 of calibrating the apparatus 150 in accordance with some aspects of the disclosure. According to the method 200, the frequency calibration unit 158 detects power up of a unit (e.g., a communication device) that incorporates the apparatus 150 (block 202). Then, the frequency calibration unit 158 may receive a frequency input word that specifies a frequency or frequency range for the oscillating signal generated by the oscillating circuit 160 (block 204). In particular applications, as discussed in more detail below, the defined frequency range may be relatively large. That is, the output frequency of the apparatus 150 need not be that accurate. For example, the specified frequency range may be as large as one percent of a defined center frequency.

Then, the frequency calibration unit 158 enables the oscillating circuit 160 by sending an oscillator enable signal to the circuits 152 and 154 to provide the first and second currents to the oscillating circuit 160 (block 206). The frequency calibration unit 158 then generates an input frequency tuning word to cause the oscillating circuit 160 to generate an oscillating signal that cycles with an initial frequency (block 208). The frequency calibration unit 158 measures the frequency of the oscillating signal from the sampled output of the oscillating circuit 160 (block 210).

The frequency calibration unit 158 then determines whether the measured frequency of the oscillating signal is within the defined range (block 212). If the frequency calibration unit 158 determines that the measured frequency is above the defined range, the frequency calibration unit 158 decrements the frequency tuning word so as to decrease the frequency of the oscillating signal (block 214). If, on the other hand, the frequency calibration unit 158 determines that the measured frequency is below the defined range, the frequency calibration unit 158 increments the input frequency tuning word so as to increase the frequency of the oscillating signal (block 216). After performing operation 214 or 216, the frequency calibration unit 158 performs another frequency measurement and comparison per operations 210 and 212, respectively.

If, in operation 212, the frequency calibration unit 158 determines that the measured frequency of the oscillating signal is within the defined range, the frequency calibration unit 158 stores the frequency tuning word (block 218). The frequency calibration unit 158 then sends a disable oscillator signal to the circuit 152 to cease generating the first current so as to disable the oscillating circuit (block 220). Note, that the frequency calibration unit 158 need not send the disable oscillator signal to the circuit 154 because the output steady-state detector 156 may have already disabled the circuit 154 after detecting the defined steady-state condition of the oscillating signal.

As previously discussed, the frequency calibration unit 158 may perform a frequency calibration of the oscillating circuit 160 when it detects an ambient temperature change that exceeds a defined threshold or when it receives a new frequency input word. In this regard, the frequency calibration unit 158 receives ambient temperature information from the ambient temperature sensor 162 (block 222). The frequency calibration unit 158 then determines whether the current ambient temperature has changed from the ambient temperature associated with the previous frequency calibration by a defined threshold (block 224). If the frequency calibration determines that the change in the ambient temperature exceeds the threshold, the frequency calibration unit 158 enables the oscillating circuit 160 (block 228) and performs another calibration routine as specified by operations 210 through 220.

If, on the other hand, the frequency calibration unit 158 determines that the change in the ambient temperature does not exceed the threshold, the frequency calibration unit 158 determines whether it has received a new frequency input word (block 226). If the frequency calibration unit 158 has not received a new frequency input word, it may return to operation 222 to determine whether the ambient temperature has changed beyond the threshold. If, on the other hand, the frequency calibration unit 158 received a new frequency input word, the frequency calibration unit 158 enables the oscillating circuit 160 again (block 228) and performs another calibration routine as specified by operations 210 through 220. The frequency calibration unit 158 may proactively test for the ambient temperature change and/or the new frequency input word, or may merely react to it via an interrupt operation.

Figure 3:
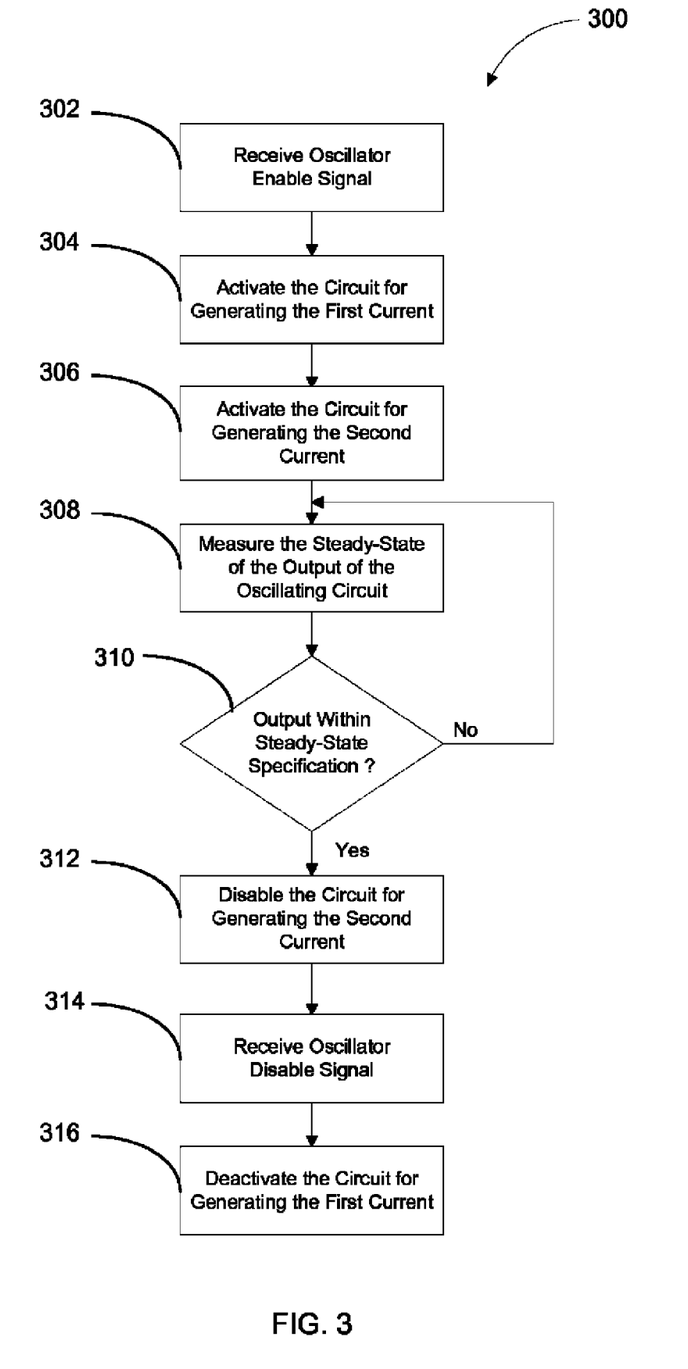
FIG. 3 illustrates a flow diagram of an exemplary method of enabling and disabling an apparatus for generating an oscillating signal in accordance with some aspects of the disclosure.

FIG. 3 illustrates a flow diagram of an exemplary method 300 of enabling and disabling the apparatus 150 in accordance with some aspects of the disclosure. According to the method 300, the apparatus 150 receives an oscillator enable signal from an external device (block 302). For example, the external device may be a pulse modulation device that is used to establish a communications channel by use of PDMA or PDM modulation techniques. In this regard, the apparatus 150 is turned on for only approximately the duration of a pulse. Thus, the leading edge of the pulse may serve as the oscillator enable signal.

In response to the oscillator enable signal, the current generating circuits 152 and 154 are activated (blocks 304 and 306) in any order or simultaneously. The activation of the circuits 152 and 154 causes the oscillating circuit 160 to begin generating an oscillating signal. As previously discussed, the circuit 154 assists in reducing the time for the oscillating signal to reach a defined steady-state condition. The defined steady-state condition may be based on the stability of the amplitude and/or frequency of the oscillating signal. For example, the defined steady-state condition may specify an amplitude stability of the oscillating signal of not varying more than 15 percent. The defined steady-state condition may also specify a frequency stability of the oscillating signal of not varying more than one (1) percent.

The output steady-state detector 156 measures the steady-state condition of the oscillating signal generated by the oscillating circuit 160 (block 308). The output steady-state detector 156 then determines whether the steady-state condition of the oscillating signal meets the requirements of the defined steady-state condition (block 310). If the steady-state condition of the oscillating signal does not meet the requirements, the output steady-state detector 156 continues to perform the operations 308 and 310 until the defined steady-state condition is met. When the output steady-state detector 156 determines that the steady-state condition of the oscillating signal meets specification, the output steady-state detector 156 disables the circuit 154 (block 312). In this way, the circuit 154 is only enabled to accelerate the oscillating signal in reaching the defined steady-state condition, thereby conserving energy during steady-state oscillations.

The apparatus 150 may then receive an oscillator disable signal from the external device (block 314). As previously discussed, the external device may disable the apparatus 150 at the end of a pulse. Accordingly, the oscillator disable signal may be the trailing edge of the pulse. In response to the oscillator disable signal, the circuit 152 is deactivated (block 316). One purpose of disabling the circuit 152 is to save power. However, the persistence of oscillation could be used to shut off the circuit 152 early, thereby saving even more power.

Figure 4:
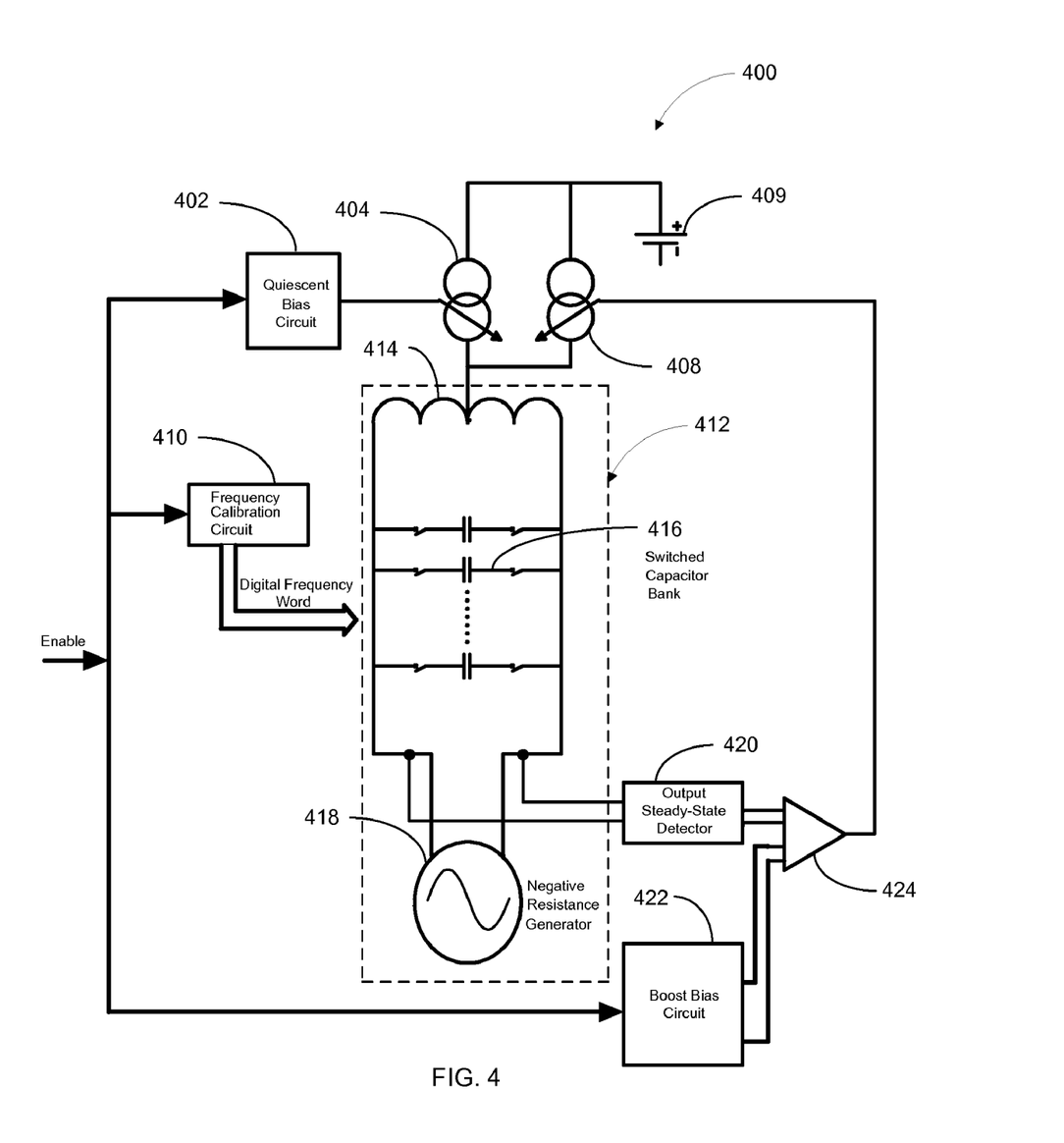
FIG. 4 illustrates a schematic diagram of an exemplary apparatus for generating an oscillating signal in accordance with some aspects of the disclosure.

FIG. 4 illustrates a schematic diagram of an exemplary apparatus 400 for generating an oscillating signal in accordance with some aspects of the disclosure. The apparatus 400 may be a detailed implementation of any of the aspects previously discussed. The apparatus 400 comprises an oscillating circuit 412 including an inductor 414 coupled in parallel with a switched capacitor bank 416 and a negative resistance generator 418. The apparatus 400 further comprises a frequency calibration circuit 410 that is adapted to calibrate the frequency of the oscillating signal generated by the oscillating circuit 412. More specifically, the frequency calibration circuit 410 generates a digital frequency word that selects which capacitors of the switched capacitor bank 416 are coupled in parallel with the inductor 414 and the negative resistance generator 418, thereby controlling the frequency of the oscillating signal. The frequency calibration circuit 410 may include a counter (not shown) to count the periods of the oscillating signal in order to measure its frequency for tuning purposes.

The apparatus 400 further comprises a direct current (DC) power supply 410, a first controllable current source 404, and a quiescent DC bias circuit 402. The power supply 409 supplies power to the first controllable current source 404. In response to receiving an enable signal, the quiescent DC bias circuit 402 controls the quiescent bias current that is applied to the oscillating circuit 412 by the first controllable current source 404. The quiescent bias current is used to start up and maintain the oscillating circuit 412 generating the oscillating signal.

The apparatus 400 further comprises a boost bias circuit 422, an output steady-state detector 420, a controllable amplifier 424, and a second controllable current source 408. The power supply 409 supplies power to the second controllable current source 408. In response to receiving the enable signal, the boost bias circuit 422 enables generates a boost bias current that is applied to the oscillating circuit 412 via the controllable amplifier 424 and the second controllable current source 408. As previously discussed, the boost bias circuit 422 assists in reducing the time for the oscillating signal to reach a defined steady-state condition. The output steady-state detector 420 is coupled to the oscillating circuit 412 to determine the steady-state condition of the oscillating signal. When the output steady-state detector 420 determines that the amplitude, frequency or both the amplitude and frequency of the oscillating signal meet a defined specification, the output steady-state detector 420 disables the controllable amplifier 424 so that the boost bias current is no longer applied to the oscillating circuit 412.

Figure 5:
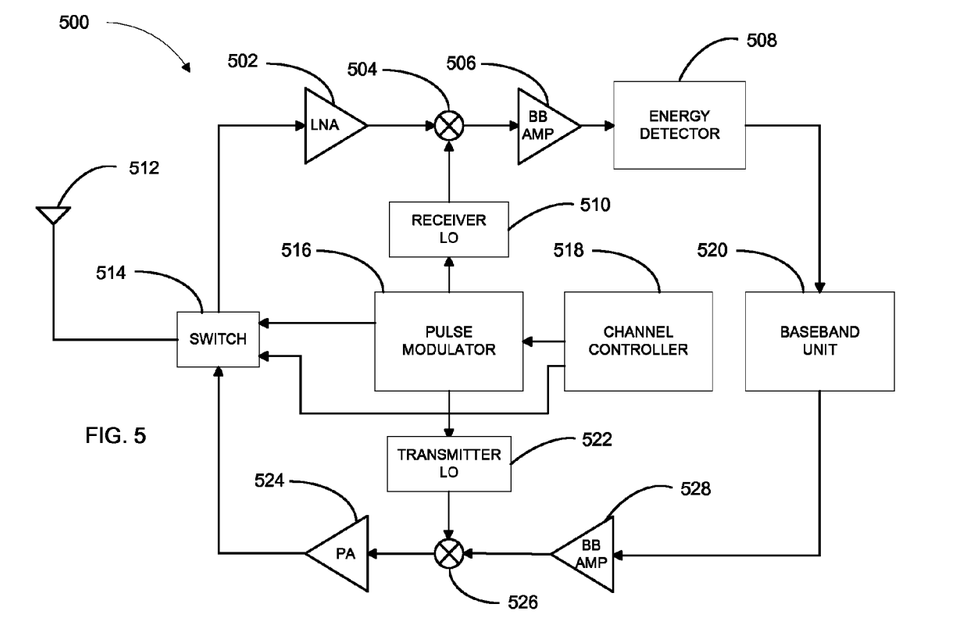
FIG. 5 illustrates a block and schematic diagram of an exemplary communication device in accordance with some aspects of the disclosure.

FIG. 5 illustrates a block diagram of an exemplary communication device 500 that uses one or more apparatuses for an oscillating signal as local oscillators (LOs) in accordance with some aspects of the disclosure. The communication device 500 comprises a receiver portion including a low noise amplifier (LNA) 502, a mixer 504, a receiver local oscillator (LO) 510, a baseband amplifier 506, and an energy detector 508. The communication device 500 further comprises a transmitter portion including a baseband amplifier 528, a mixer 526, a transmitter LO 522, and a power amplifier 524. The communication device 500 further comprises an antenna 512, and a switch 514 to selectively isolate the transmitter portion from the receiver portion during transmission. Additionally, the communication device 500 comprises a baseband unit 520, a channel controller 518, and a pulse modulator 516. The baseband unit 520 processes baseband signals received from the receiver portion, and processes baseband signals for transmission by the transmitter portion.

The pulse modulator 516 is coupled to the receiver LO 510 to enable the receiver LO at particular instances defined by pulses in order to establish a receiving communication channel (e.g., an ultra-wide band (UWB) communication channel) using pulse division multiple access (PDMA), pulse division multiplexing (PDM), or other type of pulse modulation. The pulse modulator 516 is also coupled to the transmitter LO 520 to enable the transmitter LO at particular instances defined by pulses in order to establish a transmitting communication channel (e.g., an ultra-wide band (UWB) communication channel) using PDMA, PDM, or other type of pulse modulation. The transmitting and receiving channels may be established concurrently, although the channels may be orthogonal so as not to interfere with each other. An ultra-wide band (UWB)) channel may be defined as a channel having a fractional bandwidth on the order of 20% or more, has a bandwidth on the order of 500 MHz or more, or has a fractional bandwidth on the order of 20% or more and has a bandwidth on the order of 500 MHz or more. The fractional bandwidth is a particular bandwidth associated with a device divided by its center frequency. For example, a device according to this disclosure may have a bandwidth of 1.75 GHz with center frequency 8.125 GHz and thus its fractional bandwidth is 1.75/8.125 or 21.5%.

The channel controller 518 is coupled to the pulse modulator 516 in order to establish the receiving and transmitting communication channels by pulse modulation techniques as discussed in more detail below. The channel controller 518 is coupled to the switch 514 to set the switch to receive mode where it couples the antenna 514 to the LNA 502 or set the switch to the transmit mode where it couples the power amplifier 524 to the antenna 512. If the communication device 500 is configured as a wireless device, such as an IEEE 802.11 or 802.15 related wireless device, the antenna 504 serves as an interface to a wireless medium for wirelessly transmitting and receiving information from other wireless device.

Using pulse modulation techniques to enable and disable the transmitter and receiver, improved power efficiency may be achieved for the communication device 500. For example, during times when the transmitter is not transmitting and receiver is not receiving, these devices may be operated in low or no power mode to conserve power, such as power provided by a battery. With regard to the transmission of data, for example, data occupying a frequency bandwidth is transmitted during a first time period within the time interval, wherein when the data is transmitted during the first time interval varies such that the variation is associated with at least two time intervals, and power consumption of some components of the communication device 500 is reduced during at least a second time period within the interval.

Figure 6A:
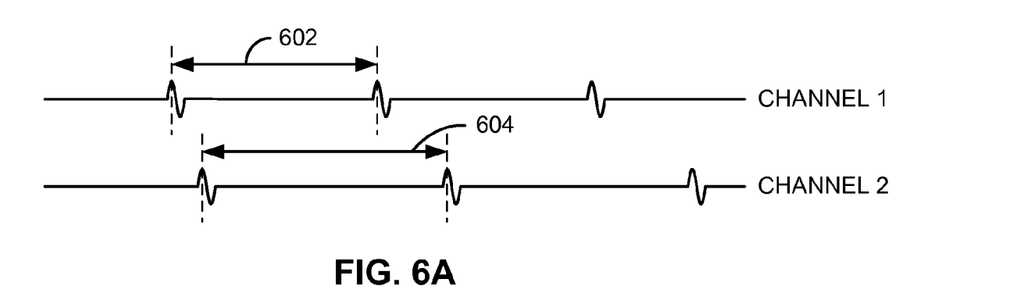
FIGS. 6A-D illustrate timing diagrams of various pulse modulation techniques in accordance with some aspects of the disclosure.

FIG. 6A illustrates different channels (channels 1 and 2) defined with different pulse repetition frequencies (PRF) as an example of a PDMA modulation. Specifically, pulses for channel 1 have a pulse repetition frequency (PRF) corresponding to a pulse-to-pulse delay period 602. Conversely, pulses for channel 2 have a pulse repetition frequency (PRF) corresponding to a pulse-to-pulse delay period 604. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel. The channel controller 518 and pulse position modulator 516 may be configured to set up a pulse repetition frequency (PRF) modulation.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 6B:
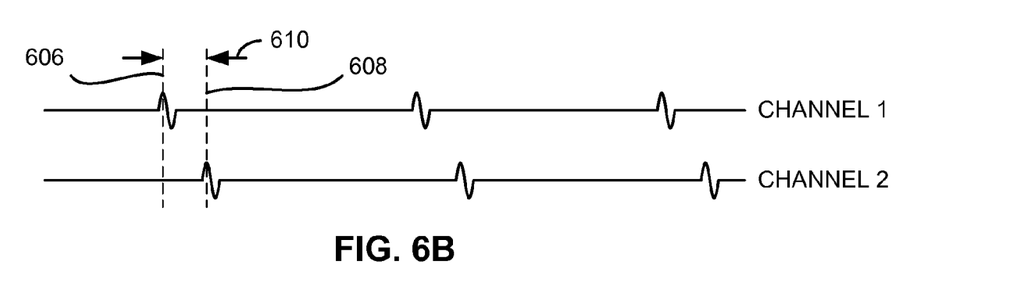

FIG. 6B illustrates different channels (channels 1 and 2) defined with different pulse positions or offsets as an example of a PDMA modulation. Pulses for channel 1 are generated at a point in time as represented by line 606 in accordance with a first pulse offset (e.g., with respect to a given point in time, not shown). Conversely, pulses for channel 2 are generated at a point in time as represented by line 608 in accordance with a second pulse offset. Given the pulse offset difference between the pulses (as represented by the arrows 610), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels. The channel controller 518 and pulse position modulator 516 may be configured to set up a position or offset modulation.

Figure 6C:
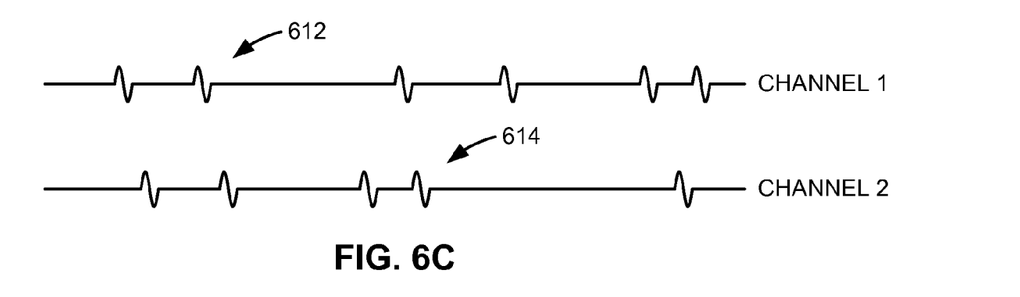

FIG. 6C illustrates different channels (channels 1 and 2) defined with different timing hopping sequences. For example, pulses 612 for channel 1 may be generated at times in accordance with one time hopping sequence while pulses 614 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels. The channel controller 518 and pulse position modulator 516 may be configured to set up a time hopping modulation.

Figure 6D:
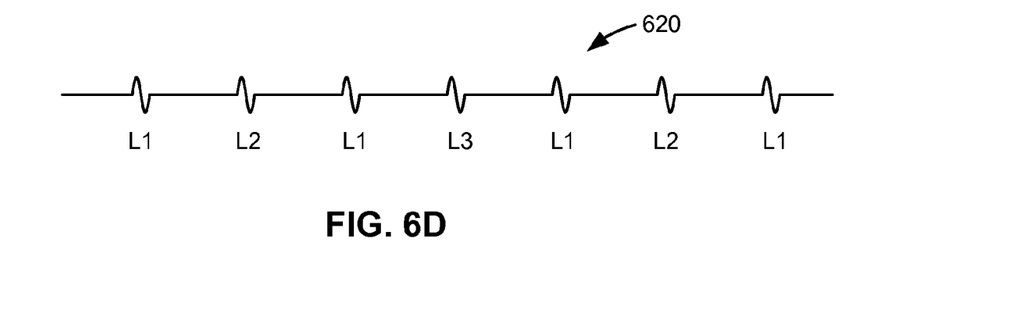

FIG. 6D illustrates different channels defined with different time slots as an example of a PDM modulation. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels. The channel controller 518 and pulse position modulator 516 may be configured to set up the PDM modulation.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 7:
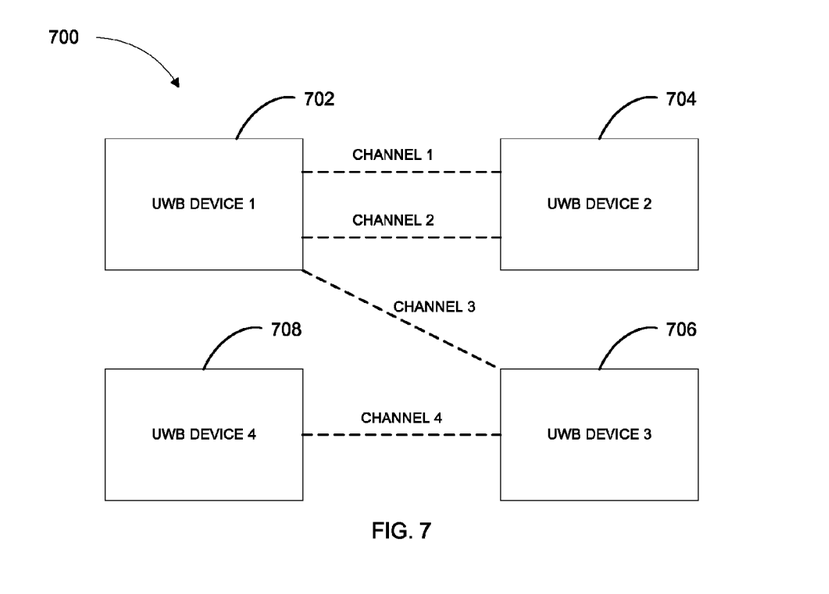
FIG. 7 illustrates a block diagram of various communication devices communicating with each other via various channels in accordance with some aspects of the disclosure.

FIG. 7 illustrates a block diagram of various ultra-wide band (UWB) communication devices communicating with each other via various channels in accordance with some aspects of the disclosure. For example, UWB device 1 702 is communicating with UWB device 2 704 via two concurrent UWB channels 1 and 2. UWB device 702 is communicating with UWB device 3 706 via a single channel 3. And, UWB device 3 706 is, in turn, communicating with UWB device 4 708 via a single channel 4. Other configurations are possible.

Any of these apparatuses described herein may take various forms. For example, in some aspects, the apparatus may be implemented in or comprise a phone (e.g., a cellular phone), a personal data assistant ("PDA"), a headset (e.g., a headphone, an earpiece, etc.), a microphone, a medical device (e.g., a biometric sensor, a heart rate monitor, a pedometer, an EKG device, etc.), a biometric sensor, a heart rate monitor, a pedometer, an EKG device, a user I/O device, a watch, a remote control, a switch, a light switch, a keyboard, a mouse, a tire pressure monitor, an entertainment device (e.g., a music or video device), a computer, a point-of-sale device, a hearing aid, a set-top box, or a device with some form of wireless signaling capabilities. Moreover, these apparatuses may have different power and data requirements. In some aspects, any apparatus described herein may be adapted for use in low power applications (e.g., through the use of a pulse-based signaling scheme and low duty cycle modes), and may support a variety of data rates including relatively high data rates (e.g., through the use of high-bandwidth pulses). In some aspects, any of the apparatuses described herein may be implemented in or comprise an access point such as a Wi-Fi node. For example, such an apparatus may provide connectivity to another network (e.g., a wide area network such as the Internet) via a wired or wireless communication link.

Any of these apparatuses may include various components that perform functions bases on signals transmitted or received via the wireless communication link. For example, a headset may include a transducer adapted to provide an audible output based on a signal received via the wireless communication link established by a receiver responsive to a local oscillator incorporating any of the aspects described herein. A watch may include a display adapted to provide a visual output based on a signal received via the wireless communication link by a receiver responsive to a local oscillator incorporating any of the aspects described herein. A medical device may include a sensor adapted to generate at least sensed signal or sensed data to be transmitted via the wireless communication link by a transmitter responsive to a local oscillator incorporating any of the aspects described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other techniques), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC") The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating an oscillating signal, comprising:
   an oscillator adapted to generate an oscillating signal;
   a first circuit to supply a first current to power up the oscillator; and
   a second circuit to supply a second current to power up the oscillator, wherein the first and second currents are adapted to reduce a time duration for the oscillating signal to reach a defined steady-state condition;
   wherein the defined steady-state condition is based on an amplitude of the oscillating signal not varying more than 15 percent.

2. The apparatus of claim 1, wherein the oscillator comprises:
   a tank circuit; and
   a negative resistance generator coupled to the tank circuit.

3. The apparatus of claim 2, wherein the tank circuit comprises:
   an inductive device; and
   a capacitive device coupled in parallel with the inductive device.

4. The apparatus of claim 3, wherein the capacitive device comprises a programmable switched capacitor bank.

5. The apparatus of claim 1, further comprising a steady-state detector adapted to disable the second circuit from supplying the second current to the oscillator in response to detecting the defined steady-state condition of the oscillating signal.

6. The apparatus of claim 1, wherein the defined steady-state condition is based on an amplitude of the oscillating signal.

7. The apparatus of claim 1, wherein the defined steady-state condition is based on a frequency of the oscillating signal.

8. The apparatus of claim 1, further comprises a transceiver responsive to the oscillating signal to establish at least one ultra-wide band communications channel with another apparatus.

9. An apparatus for generating an oscillating signal, comprising:
    an oscillator adapted to generate an oscillating signal;
    a first circuit to supply a first current to power up the oscillator; and
    a second circuit to supply a second current to power up the oscillator, wherein the first and second currents are adapted to reduce a time duration for the oscillating signal to reach a defined steady-state condition;
    wherein the defined steady-state condition is based on a frequency of the oscillating signal not varying more than one (1) percent.

10. An apparatus for generating an oscillating signal, comprising:
    an oscillator adapted to generate an oscillating signal;
    a first circuit to supply a first current to power up the oscillator;
    a second circuit to supply a second current to power up the oscillator, wherein the first and second currents are adapted to reduce a time duration for the oscillating signal to reach a defined steady-state condition; and
    a frequency calibration unit adapted to tune the oscillator so that the oscillating signal cycles within a frequency range.

11. The apparatus of claim 10, wherein the frequency range is equal to one (1) percent of a center frequency.

12. The apparatus of claim 10, wherein the frequency calibration unit is adapted to tune the oscillator upon power up of the apparatus, upon detecting an ambient temperature change above a defined threshold, or upon receiving a new frequency word for the oscillator.

13. An apparatus for generating an oscillating signal, comprising:
    an oscillator adapted to generate an oscillating signal;
    a first circuit to supply a first current to power up the oscillator;
    a second circuit to supply a second current to power up the oscillator, wherein the first and second currents are adapted to reduce a time duration for the oscillating signal to reach a defined steady-state condition; and
    a transceiver responsive to the oscillating signal to establish at least one ultra-wide band communications channel with another apparatus;
    wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

14. A method of generating an oscillating signal, comprising:
    generating a first current;
    generating a second current; and
    initiating the generation of an oscillating signal in response to the first and second currents, wherein the second current reduces a time duration for the oscillating signal to reach a defined steady-state condition;
    wherein the defined steady-state condition is based on an amplitude of the oscillating signal not varying more than 15 percent.

15. The method of claim 14, wherein initiating the generation of the oscillating signal is accomplished by:
    a tank circuit; and
    a negative resistance generator coupled to the tank circuit.

16. The method of claim 15, wherein the tank circuit comprises:
    an inductive device; and
    a capacitive device coupled in parallel with the inductive device.

17. The method of claim 16, wherein the capacitive device comprises a programmable switched capacitor bank.

18. The method of claim 14, further comprising disabling the generating of the second current in response to detecting the defined steady-state condition of the oscillating signal.

19. The method of claim 14, wherein the defined steady-state condition is based on an amplitude of the oscillating signal.

20. The method of claim 14, wherein the defined steady-state condition is based on a frequency of the oscillating signal.

21. The method of claim 14, further comprising establishing at least one ultra-wide band communications channel using the oscillating signal.

22. A method of generating an oscillating signal, comprising:
    generating a first current;
    generating a second current; and
    initiating the generation of an oscillating signal in response to the first and second currents, wherein the second current reduces a time duration for the oscillating signal to reach a defined steady-state condition;
    wherein the defined steady-state condition is based on a frequency of the oscillating signal not varying more than one (1) percent.

23. A method of generating an oscillating signal, comprising:
    generating a first current;
    generating a second current;
    initiating the generation of an oscillating signal in response to the first and second currents, wherein the second current reduces a time duration for the oscillating signal to reach a defined steady-state condition; and
    calibrating the oscillating signal so that it cycles within a frequency range.

24. The method of claim 23, wherein the frequency range is equal to one (1) percent of a center frequency.

25. The method of claim 23, wherein calibrating the oscillating signal is performed in response to detecting power up, to detecting an ambient temperature change above a defined threshold, or to receiving a new frequency word.

26. A method of generating an oscillating signal, comprising:
    generating a first current;
    generating a second current;
    initiating the generation of an oscillating signal in response to the first and second currents, wherein the second current reduces a time duration for the oscillating signal to reach a defined steady-state condition; and
    establishing at least one ultra-wide band communications channel using the oscillating signal;

wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

27. An apparatus for generating an oscillating signal, comprising:
   means for generating an oscillating signal;
   means for supplying a first current to power up the oscillating signal generating means so as to initiate the generation of the oscillating signal; and
   means for supplying a second current to power up the oscillating signal generating means so as to initiate the generation of the oscillating signal, wherein the first and second currents are adapted to reduce a time duration for the oscillating signal to reach a defined steady-state condition;
   wherein the defined steady-state condition is based on an amplitude of the oscillating signal not varying more than 15 percent.

28. The apparatus of claim 27, wherein the oscillating signal generating means comprises:
   a tank circuit; and
   a negative resistance generator coupled to the tank circuit.

29. The apparatus of claim 28, wherein the tank circuit comprises:
   an inductive device; and
   a capacitive device coupled in parallel with the inductive device.

30. The apparatus of claim 29, wherein the capacitive device comprises a programmable switched capacitor bank.

31. The apparatus of claim 27, further comprising means for disabling the second current supplying means from supplying the second current in response to detecting the defined steady-state condition of the oscillating signal.

32. The apparatus of claim 27, wherein the defined steady-state condition is based on an amplitude of the oscillating signal.

33. The apparatus of claim 27, wherein the defined steady-state condition is based on a frequency of the oscillating signal.

34. The apparatus of claim 27, further comprising means for establishing at least one ultra-wide band communications channel with another apparatus using the oscillating signal.

35. An apparatus for generating an oscillating signal, comprising:
   means for generating an oscillating signal;
   means for supplying a first current to power up the oscillating signal generating means so as to initiate the generation of the oscillating signal; and
   means for supplying a second current to power up the oscillating signal generating means so as to initiate the generation of the oscillating signal, wherein the first and second currents are adapted to reduce a time duration for the oscillating signal to reach a defined steady-state condition;
   wherein the defined steady-state condition is based on a frequency of the oscillating signal not varying more than one (1) percent.

36. An apparatus for generating an oscillating signal, comprising:
   means for generating an oscillating signal;
   means for supplying a first current to power up the oscillating signal generating means so as to initiate the generation of the oscillating signal;
   means for supplying a second current to power up the oscillating signal generating means so as to initiate the generation of the oscillating signal, wherein the first and second currents are adapted to reduce a time duration for the oscillating signal to reach a defined steady-state condition; and
   means for calibrating the oscillating signal generating means so that the oscillating signal cycles within a frequency range.

37. The apparatus of claim 36, wherein the frequency range is equal to one percent of a center frequency.

38. The apparatus of claim 36, wherein the calibration means is adapted to calibrate the oscillating signal generating means upon power up of the apparatus, upon detecting an ambient temperature change above a defined threshold, or upon receiving a new frequency word for the oscillating signal generating means.

39. An apparatus for generating an oscillating signal, comprising:
   means for generating an oscillating signal;
   means for supplying a first current to power up the oscillating signal generating means so as to initiate the generation of the oscillating signal;
   means for supplying a second current to power up the oscillating signal generating means so as to initiate the generation of the oscillating signal, wherein the first and second currents are adapted to reduce a time duration for the oscillating signal to reach a defined steady-state condition; and
   means for establishing at least one ultra-wide band communications channel with another apparatus using the oscillating signal;
   wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

40. A computer readable medium for generating an oscillating signal comprising codes executable by at least one computer to:
   generate an oscillating signal;
   supply a first current to produce the generation of the oscillating signal; and
   supply a second current to produce the generation of the oscillating signal, wherein the second current reduces a time duration for the oscillating signal to reach a defined steady-state condition;
   calibrate the oscillating signal so that it cycles within a frequency range.

* * * * *